United States Patent
Harris et al.

(10) Patent No.: US 8,102,629 B2
(45) Date of Patent: Jan. 24, 2012

(54) LEAKAGE CURRENT COMPENSATION FOR HIGH VOLTAGE TRANSFORMERS

(75) Inventors: William R. Harris, Rochester, NY (US); Jerry F. Adams, Waterport, NY (US)

(73) Assignee: Xerox Corporation, Norwalk, CT (US)

( * ) Notice: Subject to any disclaimer, the term of this patent is extended or adjusted under 35 U.S.C. 154(b) by 355 days.

(21) Appl. No.: 12/403,037

(22) Filed: Mar. 12, 2009

(65) Prior Publication Data

US 2010/0231229 A1  Sep. 16, 2010

(51) Int. Cl.
*H02H 9/02* (2006.01)
(52) U.S. Cl. .......................... 361/42; 307/149
(58) Field of Classification Search .................. 307/149; 361/42, 45
See application file for complete search history.

(56) References Cited

U.S. PATENT DOCUMENTS

| | | | | |
|---|---|---|---|---|
| 3,654,515 A | * | 4/1972 | Kato et al. | 361/45 |
| 3,760,298 A | * | 9/1973 | Pell | 333/12 |
| 3,984,736 A | * | 10/1976 | Rai | 361/44 |
| 6,909,286 B2 | | 6/2005 | Hori | 324/401 |
| 7,113,430 B2 | | 9/2006 | Hoefler et al. | 365/185.23 |
| 7,298,664 B2 | | 11/2007 | Lee | 365/229 |
| 7,397,680 B2 | | 7/2008 | Odell | 363/143 |
| 7,397,708 B2 | | 7/2008 | Oh | 365/189.01 |
| 7,453,725 B2 | | 11/2008 | Chan et al. | 365/185.08 |
| 2006/0250179 A1 | | 11/2006 | Lee | 327/541 |
| 2007/0030057 A1 | | 2/2007 | Wang et al. | 327/554 |
| 2007/0030738 A1 | | 2/2007 | Oh | 365/189.01 |

FOREIGN PATENT DOCUMENTS

GB  2460272  *  5/2008

* cited by examiner

*Primary Examiner* — Albert W Paladini
(74) *Attorney, Agent, or Firm* — Kermit D. Lopez; Luis M. Ortiz; Ortiz & Lopez, PLLC

(57) ABSTRACT

A method and system for measuring and compensating for a leakage current in a high voltage transformer. Such a method and/or system include the use of a primary winding and a secondary winding, which can be provided on a core of a soft-magnetic material. A current transformer can be placed about the leads to both the terminals of the primary winding. The current transformer can be utilized to reliably measure the leakage current flowing from the secondary winding to the primary winding through one or more amplifiers to a ground terminal. The leakage current flows back to the transformer secondary winding through a low-side current sense resistor. The total current monitor signal can be generated by the low-side current sense resistor and the leakage current measured by the current transformer is vector-subtracted from the total current monitor signal. The result is a current monitor signal fully representative of the high voltage transformer's actual load current.

20 Claims, 3 Drawing Sheets

LEAKAGE CURRENT COMPENSATION FOR HIGH VOLTAGE TRANSFORMERS

TECHNICAL FIELD

Embodiments are generally related to high voltage power supplies. Embodiments are also related to voltage transformers. Embodiments are additionally related to leakage current compensation for high voltage transformers.

BACKGROUND OF THE INVENTION

High voltage transformers convert voltages from one level or phase configuration to another, usually from a lower to a higher voltage. High voltage transformers can be configured to provide for electrical isolation and may employ features for power distribution, control, and instrumentation applications. High voltage transformers usually function based on the principle of magnetic induction between coils to convert voltage and/or current levels. An alternating current in a primary winding associated with the transformer can create a changing magnetic field, which in turn induces a variable voltage in a secondary winding. Note that high voltage transformers can be configured in the context of either a single-phase primary configuration or a three-phase configuration.

One of the many non-ideal characteristics of a real transformer is leakage current associated with the transformer. In general, leakage current can be defined as a capacitive current that flows as a result of a capacitive coupling between the secondary and primary windings associated with the transformer. The high voltage present on the upper end of the secondary winding may be responsible for a relatively large capacitive current that flows from the secondary winding and then back to the primary winding (and sometimes to a core).

Transformer designs can be manipulated to minimize such leakage current; however, the leakage current may not be completely eliminated. The leakage current is not always a problem, particularly if the leakage current is capable of being minimized in the transformer design. Such leakage current may, however, become a problem with an AC (Alternating Current) output high voltage power supply.

An AC output high voltage power supply utilizes a secondary low-side current sensing approach in which the output current is returned to the secondary winding through a current sense resistor. However, the current sense resistor senses both the output current and the leakage current returning to the secondary winding. Such an approach typically generates a resulting error in a current monitor, which may present a significant problem. The measurement of the return current, however, can be filtered to eliminate the AC leakage current in DC (Direct Current) outputs.

FIG. 1 illustrates a circuit diagram of a prior art high voltage power supply 100 associated with a high voltage transformer 150. The high voltage power supply 100 generally includes a high voltage transformer 150 comprising a primary winding 120 and a secondary winding 130, which are provided with respect to a core 110 of a soft-magnetic material. The high voltage power supply 100 further includes a power stage that may include, but is not limited to, two operational amplifiers 140 and 160 driven 180 degrees out of phase, which are capable of switching the voltage across the transformer primary winding 120, thereby producing the desired secondary voltage Vout. The secondary current can then be measured utilizing a small sense resistor RCS located between a ground terminal and the low side of the secondary winding 130. The voltage across the small sense resistor RCS can be rectified and scaled and utilized for diagnostics and fault detection purposes.

The bold arrows 163 and 165 depicted in FIG. 1 generally indicate the path of conventional (ideal) primary current flow in the high voltage transformer 150. Note that the direction of primary current flow indicated in FIG. 1 is depicted for general illustrative purposes only; however, it can be appreciated that the primary current may change direction periodically. Note that the arrows 157, 159, and 161 depicted in FIG. 1 can define a path for the leakage current, starting at the high voltage side of the secondary winding 130. The leakage current represented by arrows 157, 159 and 161 may constitute an alternating current and is capable of changing direction at a particular switching frequency.

The leakage current represented by arrows 157, 159, and 161 in FIG. 1 generally flows from the high voltage side of the secondary winding 130 via the leakage capacitors CL1 and CL2 (which are not true capacitor components, but rather represent the parasitic capacitance between the high voltage secondary winding and the low voltage primary winding), the amplifier circuits 140 and 160 to a ground terminal and back to the secondary lower side through the current sense resistor RCS. The primary current 165 flows through the primary winding 120 during operation. Hence, it is extremely difficult to differentiate between the primary current represented by arrows 163 and 165 and the leakage current represented by arrows 157, 159, 161, where the primary current indicated by arrows 163 and 165 is many orders of magnitude higher than the leakage current.

The majority of prior art approaches for compensating leakage currents in current monitors can be derived from a secondary side current measurement. Such an approach can post-scale rectified and filtered current sense signals by a fixed amount to compensate for an average leakage current. The leakage current is always purely capacitive whereas a load current can be reactive or resistive or a combination, hence, such prior art compensation methods can only function over a limited range of load currents. Additionally, an average leakage current can be determined only if the actual transformer primary to secondary capacitance is nearly equal to the reference capacitance. Finally, the idealized leakage capacitance is not necessarily constant, but may vary with voltage and, to some extent, environmental conditions.

Based on the foregoing, it is believed that a need exists for an improved method capable of compensating for leakage current in a high voltage transformer. A need also exists for an improved means of sensing leakage current, as described in greater deal herein.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for an improved high voltage transformer monitoring and controlling function.

It is another aspect of the present invention to provide for a method and/or system for employing current transformers for measuring leakage current.

It is a further aspect of the present invention to provide for an improved method and system for compensating leakage current in a high voltage AC transformer.

The aforementioned aspects and other objectives and advantages can now be achieved as described herein. A method and system for measuring and compensating for a leakage current in a high voltage transformer is disclosed. The high voltage transformer (e.g., alternating current transformer) includes a primary winding and a secondary winding, which can be provided on a core of a soft-magnetic material. A current transformer (e.g., current sense coil) can be placed around the leads to both the terminals of the primary winding.

The current transformer can be utilized to reliably measure the leakage current flowing from the secondary winding to the primary winding through one or more amplifiers to a ground terminal. The leakage current flows back to the transformer secondary winding through a low-side current sense resistor. The total current monitor signal can be generated by the current sense resistor and the leakage current is vector-subtracted from the current monitor signal. The current transformer can be utilized to vector-subtract the leakage current from the total current monitor signal. The leakage current to the core can also be optionally measured and compensated for utilizing a second sense resistor.

The voltage signal generated by the current transformer can be scaled appropriately in order to subtract the appropriate magnitude and phase from the current monitor signal generated by the secondary low-side current sense resistor. The current transformer can measure a zero current flow for an ideal transformer with no leakage current, as all the current flowing into the primary winding via the current transformer in one direction can also flow back out of the primary winding through the current transformer in an opposite direction. Thus, the current flowing in "cancels out" the current flowing out, making the net current measurement for the ideal case zero. The current transformer provides a valid measurement for the leakage current for a non-ideal transformer.

The high voltage transformer can be implemented in the context of, for example, a full-bridge type circuit associated with active amplifiers driving both ends of the primary winding. The approach may be utilized with many different topologies, but the intended outcome is that all current flowing into the primary and all current flowing back out of the primary be measured by the current transformer. The current transformer can be configured to include one or more conductors routed through a hole in the center of a core.

The high voltage transformer associated with the High Voltage Power Supply can be designed to minimize the leakage current, but it is not possible to eliminate the leakage current completely from the current monitor measurement by transformer design alone. The proposed approach can also be utilized to re-create a certain amount of leakage current and/or to maintain the same leakage current present in an existing design (this may be required in a situation where an older power supply or transformer is being replaced by a new design, or by a new transformer from a new vendor) thereby preventing changes in an offset present on the current monitor due to transformer higher/lower leakage current.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 2:
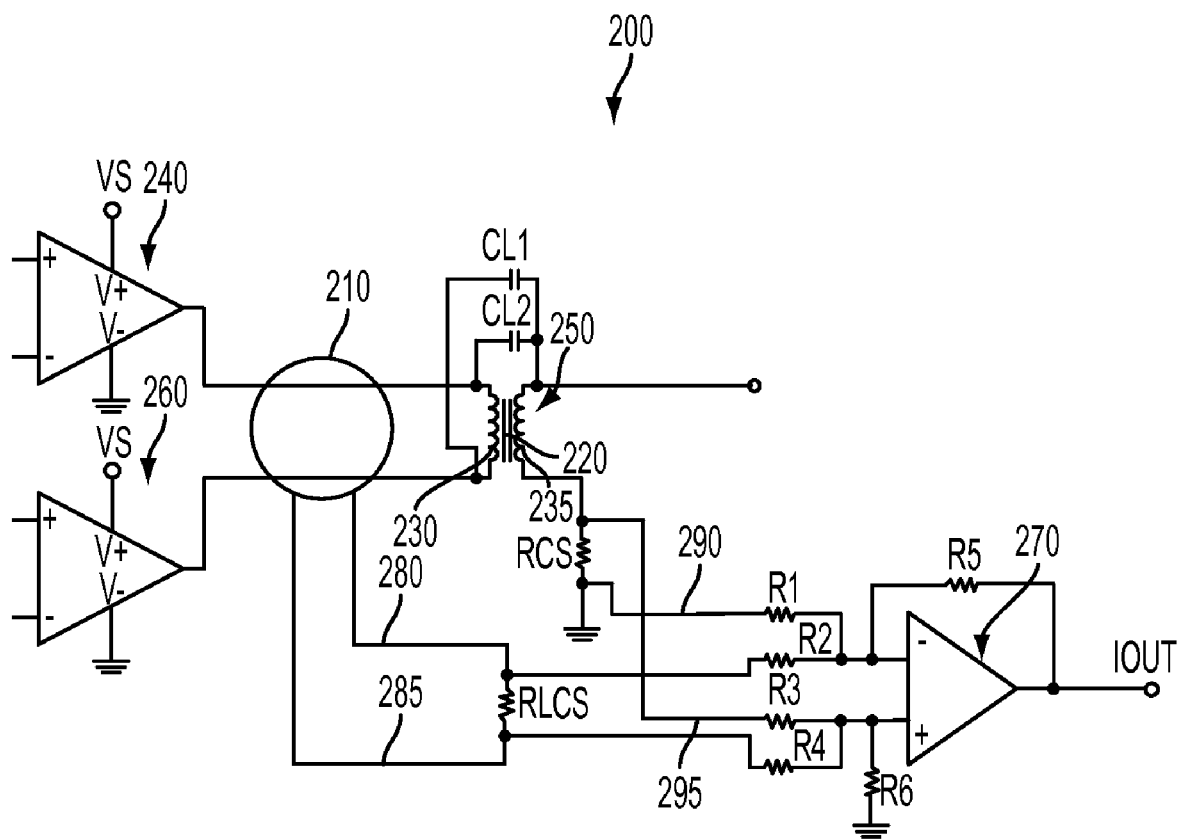
FIG. 2 illustrates a circuit diagram of a high voltage power supply associated with a high voltage transformer and a current transformer for compensating leakage current, in accordance with a preferred embodiment.

FIG. 2 illustrates a circuit diagram of a high voltage power supply system 200 that includes a high voltage transformer 250 and a current transformer 210 for compensating leakage current, in accordance with a preferred embodiment. The high voltage power supply system 200 can be implemented, for example, as an AC output high voltage power supply associated with a secondary low-side current sensing capability. The high voltage transformer 250 depicted in FIG. 2 generally includes a core 220, a primary winding 230 and a secondary winding 235. The primary winding 230 and the secondary winding 235 can be configured on the core 220 at the corresponding winding sections, as depicted in FIG. 2. Note that the core 220 may be configured from a soft magnetic material such as, for example, ferrite, or another suitable material.

The primary winding 230 and the secondary winding 235 can be separated by a particular distance. Note that the distance between the corresponding layers of the primary winding 230 and the secondary winding 235 can increase as the number of winding layers increase. The high voltage transformer 250 can be utilized in a full-bridge type circuit associated with active amplifiers driving both ends of the primary winding 230. It can be appreciated, however, that such embodiments can be implemented in the context of other circuits and designs and may be subject to change by skilled persons within the scope of the invention without departing from the concept thereof.

The high voltage power supply system 200 further includes a power stage having two operational amplifiers 240 and 260 driving 180 degrees out of phase, which switch voltage across the transformer primary winding 230, producing the desired secondary voltage Vout. The amplifiers 240 and 260 can be electrically connected to the two terminals of the primary winding 230. Typically, the voltage source VS is a DC voltage supplied or generated from an external DC or AC source. The voltage source VS may include the use of other types of AC or DC power supplies, however, without departing from the invention. The power amplifiers 240 and 260 are typically fed by an input signal source such as an onboard function generator, a crystal oscillator circuit, or other source. In the case of a High Voltage AC Power Supply, this signal source is typically a sinusoidal waveform. The high voltage transformer 250 may be any ferro or non-ferro-type high voltage transformer with the magnetic core 220 grounded to earth. The low end of transformer secondary winding 235 can be connected via a sensing resistor RCS to a ground terminal.

A current transformer 210 can be placed around the leads to both the terminals of the primary winding 230. Note that the term "current transformer" as utilized herein also refers to a current sense coil. The current transformer 210 generally includes one or two conductors that are routed through a hole in the center of a torroidal core (not shown). The current sense transformer 210 can be utilized to measure current passing through the conductors. Typical applications for current sense transformers include overload sensing, load variation sensing, and electric power metering. The construction of the current sense transformer 210 depends on the desired transformer efficiency, which in turn is determined by the requirements of the application that uses the current sense transformer 210.

The current transformer 210 can be utilized to reliably measure the leakage current flowing from the transformer secondary winding 235 to the primary winding 230. The leakage current flows via the leakage capacitors CL1 and CL2 (which are not true capacitor components, but rather represent the parasitic capacitance between the high voltage secondary winding and the low voltage primary winding), amplifiers 240 and 260 to the ground terminal and back to the transformer secondary winding 235 through the low-side current sense resistor RCS. The leakage current can be defined as the capacitive current that flows as a result of the capacitive coupling (illustrated here by CL1 and CL2) between the transformer's secondary winding 235 and the primary winding 230. Note that the leakage current can be an alternating current and can change direction at a switching frequency.

The total negative current monitors (290 and 295) can be measured utilizing the sense resistor RCS connected between the ground terminal and the low side of the secondary winding 235. The current transformer 210 can measure current flow in the primary winding 230 associated with the high voltage transformer 250 and can output a respective voltage signal. Note that the current transformer 210 is capable of detecting either positive or negative current. The leakage currents (280 and 285) can be measured utilizing the current transformer 210. The voltage signal generated by the current transformer 210 can be scaled appropriately (but not rectified or shifted in phase), in order to subtract the appropriate magnitude and phase from the current monitors 290 and 295 generated by the secondary low-side current sense resistor RCS.

A subtraction amplifier 270 can be utilized to vector-subtract the leakage currents 280 and 285 (measured by the current transformer) from the total current monitor signals 290 and 295. Such an arrangement can measure a zero current flow for an ideal transformer with no leakage current, which would not alter the current monitor signal. The output signals 280-285 and 290-295 can be transmitted to an operational amplifier 270 along with resistors R1-R6, implements a simple differential subtraction circuit. The resistor R5 is connected between the inverse input terminal (−) and the output terminal of the operational amplifier 270. The operational amplifier 270 is implemented in a differential subtraction amplifier configuration. The operational amplifier 270 utilizes positive leakage current signal 280 and negative current monitor signal 290 as inverting input. The negative leakage current signal 285 and the positive current monitor signal 295 can be utilized as non-inverting input. The operational amplifier 270 provides a scaled voltage output, Iout, which is representative of the actual power supply output current.

The current transformer 210 can measure a zero current flow for an ideal transformer with no leakage current, as all the current flowing into the primary winding 230 through the current transformer 210 in one direction can also flow back out of the primary winding 230 through the current transformer 210 in an opposite direction, canceling each other. With a non-ideal transformer, however, the leakage current must also flow through the current transformer 210, which will not be canceled out, providing a valid measurement for the leakage current.

Figure 1:
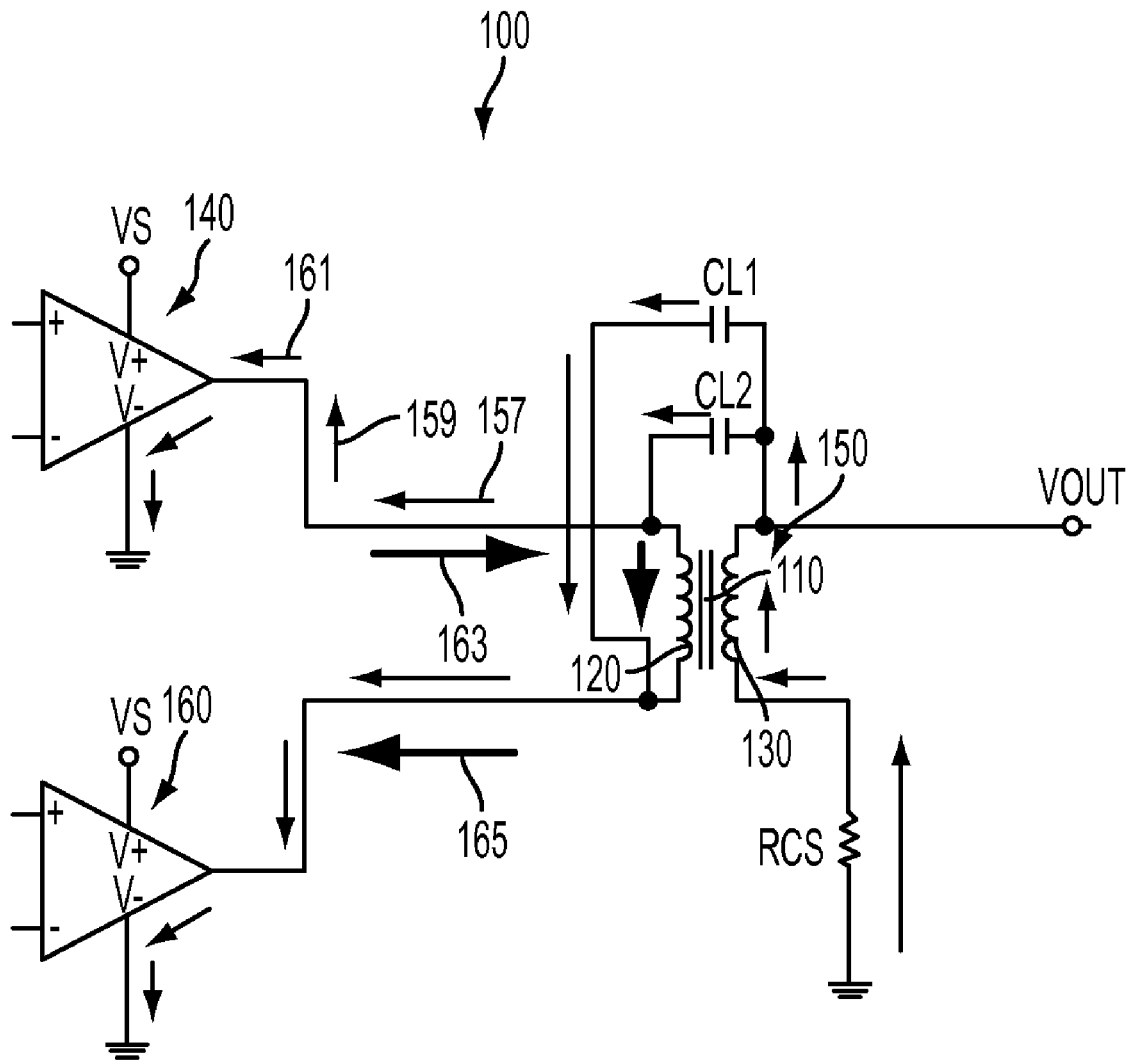
FIG. 1 illustrates a circuit diagram of a prior art high voltage power supply associated with a high voltage transformer.
Figure 3:
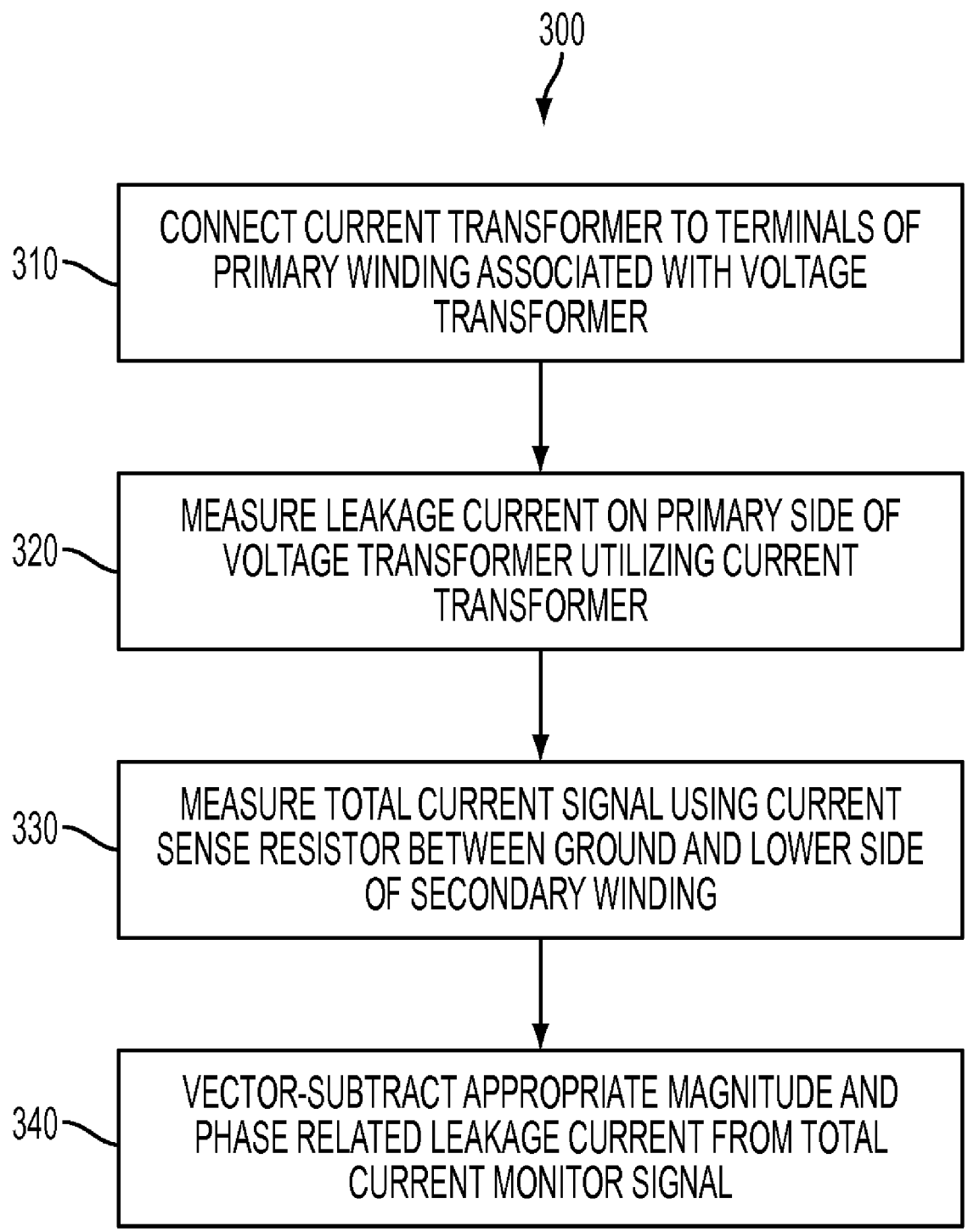
FIG. 3 illustrates a high level flow chart of operation illustrating logical operational steps of a method for compensating leakage current in the high voltage transformer, which can be implemented in accordance with a preferred embodiment.

FIG. 3 illustrates a high level flow chart of operation illustrating logical operational steps of a method 300 for compensating for leakage current in the high voltage transformer 250, in accordance with a preferred embodiment. Note that in FIGS. 1-3, identical or similar blocks are generally indicated by identical reference numerals. The current transformer 210 can be connected to terminals of the primary winding 230 associated with the voltage transformer 250, as shown at block 310. The leakage currents 280 and 285 can be measured on the primary side of voltage transformer 250 utilizing the current transformer 210, as illustrated at block 320. The total current signals 290 and 295 can be measured utilizing the current sense resistor RCS between ground and lower side of secondary winding 235, as depicted at block 330. The appropriate magnitude and phase related to the leakage currents 280 and 285 can be vector subtracted from the total current monitor signals (also containing magnitude and phase) 290 and 295, as shown at block 340.

The current transformer 210 can straddle three primary leads (two ends of the primary winding and a center-tap lead) for a center-tapped transformer (not shown). The primary current flows through one side of the primary winding at a time and when the switch on the opposite side is open, no current will flow. Hence, current will only flow through the current transformer 210 through the center-tap leg and one of the end leads at any given time, resulting in the same canceling effect as described above. Even during switching transitions, all current flowing into the center tap from the power source can also return through one or both of the two ends of the primary winding, resulting in the same current cancellation.

The method 300 can be utilized to eliminate the leakage current completely from the current monitor measurement. The disclosed method 300 can also be utilized to re-create a certain amount of leakage current, such as when a part is being re-designed by a new vendor. For example, the current measurement is often utilized in Xerographic rendering devices to determine the health of the subsystem and sometimes generate faults. Hence, in such case, the method 300 can be utilized to maintain the same leakage current present on the old design, preventing changes in the "offset" present on the current monitor due to the new transformer's higher/lower leakage current.

Various alterations and modifications will occur to those skilled in the art from the foregoing detailed description of the invention and the accompanying drawings. It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A method comprising:

passing a first current through a primary winding of a voltage transformer to induce a second current on a secondary winding of said voltage transformer via a magnetic core;

coupling to said first current using a current transformer in proximity to said primary winding to generate a primary sense current signal that is representative of said first current driving a first current sense resistor with said primary sense current signal to create a first voltage representing a magnitude and phase of said current on said primary winding;

driving a second current sense resistor with said second current on said secondary winding to create a second voltage representing a magnitude and phase of said current on said secondary winding; and vector-subtracting said first and second voltage thereby providing a signal representing a leakage current of said voltage transformer.

2. The method of claim 1 wherein said second current sense resistor is placed between a ground and said secondary winding.

3. The method of claim 1 further comprising scaling said signal representative of said leakage current.

4. The method of claim 1 further comprising configuring said current transformer utilizing formed in a ferrous core.

5. The method of claim 1 wherein said voltage transformer is a high voltage transformer.

6. The method of claim 1 further comprising utilizing said leakage current signal in a power amplifier circuit.

7. The method of claim 1 further comprising:
configuring said voltage transformer as part of a power amplifier circuit; and
coupling said power amplifier circuit to at least one active amplifier or switch that drives or switches said current to said primary winding.

8. The method of claim 1 further comprising providing a near zero leakage current signal, if said voltage transformer exhibits near ideal transformer characteristics.

9. The method of claim 1 wherein vector subtracting said first voltage from said second voltage using a voltage divider to:
decrease said sensitivity of said system to said leakage current; or
increase said sensitivity of said system to said leakage current.

10. A system comprising:
a current transformer coupled to a first and second terminals of a primary winding of a voltage transformer, to sense a current through said primary winding, said voltage transformer having a secondary winding and a core;
a measuring component to sense a current flowing through, said secondary winding
a vector subtraction circuit to combine said primary sense current with said secondary sense current to represent a current leakage of said transformer;
a scaling component to scale said leakage current of said transformer to a different level.

11. The system of claim 10 wherein said current sense resistor is connected between a ground and a side of said secondary winding.

12. The system of claim 10 wherein said current monitor and said leakage current are measured utilizing an operational amplifier.

13. The system of claim 10 wherein said current transformer comprises at least two conductors routed through a core.

14. The system of claim 10 wherein said voltage transformer is a high voltage transformer.

15. The system of claim 10 wherein said system is connected to a high voltage power amplifier circuit.

16. The system of claim 10 wherein said voltage transformer drives a high voltage power amplifier circuit.

17. The system of claim 5 wherein said high voltage power amplifier is associated with at least one active amplifier that drives or switches one or both ends of said primary winding.

18. The system of claim 15 wherein said primary sense current leakage is vector subtracted from said secondary sense current using a voltage divider to:
scale a measured leakage current of said transformer creating a certain amount of voltage from said primary sense current to adjust a bias of said system; or
scale said primary sense current to prevent changes in an offset present as part of said current monitor signal.

19. A system for compensating for leakage current, comprising:
a voltage transformer having a primary winding, a secondary winding and a core, wherein said voltage transformer accepts an input current on said primary winding;
a current transformer coupled to said primary winding to generate a first sense current based on said input current
a current sense component, to sense a second current which is representative of a current flowing through said secondary winding
a current sense resistor that accepts said second sense current and creates a current sense voltage; and
a vector-subtract module to vector subtract an appropriate magnitude and a phase related to said second sense current from said first sense current thereby providing a signal representative of said leakage current of said high voltage transformer.

20. The system of claim 19 wherein said current transformer comprises at least two conductors routed through a core.

* * * * *